United States Patent
Kuroda et al.

(10) Patent No.: US 7,203,014 B2
(45) Date of Patent: Apr. 10, 2007

(54) PREFORMAT METHOD FOR MAGNETIC RECORDING MEDIUM, MAGNETIC RECORDING MEDIUM, AND MAGNETIC RECORDING AND REPRODUCING APPARATUS

(75) Inventors: Sumio Kuroda, Kawasaki (JP); Kazuyuki Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/632,293

(22) Filed: Aug. 1, 2003

(65) Prior Publication Data
US 2004/0042107 A1 Mar. 4, 2004

(30) Foreign Application Priority Data
Aug. 30, 2002 (JP) ............................. 2002-255795

(51) Int. Cl.
*G11B 5/09* (2006.01)
(52) U.S. Cl. ..................... 360/48; 360/51; 360/75; 360/17
(58) Field of Classification Search ................. 360/17, 360/48, 51, 75, 49, 62
See application file for complete search history.

(56) References Cited

U.S. PATENT DOCUMENTS

| | | | | |
|---|---|---|---|---|
| 4,748,611 A | * | 5/1988 | Tsuyoshi et al. | ............. 369/59.2 |
| 5,539,723 A | * | 7/1996 | Hoshino et al. | .......... 369/47.31 |
| 5,680,267 A | * | 10/1997 | Tanaka et al. | ................. 360/51 |
| 6,084,731 A | * | 7/2000 | Uchida et al. | ................. 360/48 |
| 6,381,292 B1 | * | 4/2002 | Yamakoshi | .................. 375/376 |
| 6,466,385 B1 | * | 10/2002 | Umeda et al. | ................. 360/16 |
| 6,529,341 B1 | * | 3/2003 | Ishida et al. | .................. 360/48 |
| 6,738,205 B1 | * | 5/2004 | Moran et al. | .................. 360/17 |
| 6,738,215 B2 | * | 5/2004 | Yatsu | ........................... 360/75 |
| 2002/0135927 A1 | * | 9/2002 | Yatsu | ........................... 360/75 |
| 2004/0075935 A1 | * | 4/2004 | Yatsu | ........................... 360/75 |

FOREIGN PATENT DOCUMENTS

| | | |
|---|---|---|
| JP | 2523316 | 5/1996 |
| JP | 62523316 | 5/1996 |
| JP | 10-269566 | 10/1998 |
| JP | 2001-134936 | 5/2001 |
| JP | 2001-243733 | 9/2001 |

* cited by examiner

*Primary Examiner*—Wayne Young
*Assistant Examiner*—Dismery Mercedes
(74) *Attorney, Agent, or Firm*—Greer, Burns & Crain, Ltd.

(57) ABSTRACT

The magnetic recording and reproducing apparatus reads a transfer clock synchronized with servo information and records a write-once clock pattern in a state where 0 is set as a delay time of the delay device 13 and 1 is set as the dividing ratio of the frequency divider 17. The apparatus corrects the delay time according to the output of the phase comparator 14 which changes on the basis of the phase difference and rewrites a write-once clock pattern. Rotation of the magnetic disk, detection of the phase difference and correction of the delay time are repeatedly preformed until no change occurs in the output of the phase comparator 14. After the output stops changing, preformat information patterns excluding the servo information pattern are recorded as fine patterns by changing the dividing ratio of the frequency divider 17 to multiply the frequency.

19 Claims, 5 Drawing Sheets

PREFORMAT METHOD FOR MAGNETIC RECORDING MEDIUM, MAGNETIC RECORDING MEDIUM, AND MAGNETIC RECORDING AND REPRODUCING APPARATUS

BACKGROUND OF THE INVENTION

1. Field of the Invention

The present invention relates to a preformat method for a magnetic recording medium, a magnetic recording medium itself, and a magnetic recording and reproducing apparatus.

2. Description of Related Art

Various kinds of technologies aiming at a higher recording density have been put to practical use for the purpose of realizing capacity increase of a magnetic recording and reproducing apparatus. Japanese Patent Application Laid-Open No. 2001-134936 discloses a technology for using photolithography technique to form (record) on a master information medium preformat information patterns including a recovery pattern, a sector mark pattern, a servo information pattern and a code data pattern as concavity and convexity patterns of a magnetic film, and for using magnetic transfer technique to transfer (record) the preformat information patterns onto a slave information medium (which is hereinafter referred to as a magnetic recording medium). The recovery pattern is a pattern to be used for synchronizing a clock of a magnetic head when the magnetic recording and reproducing apparatus records/reproduces information; the sector mark pattern is a pattern indicating the beginning of a sector; the servo information pattern is a pattern to be used for detecting the relative position of a track on the magnetic recording medium with regard to the magnetic head; and the code data pattern is a pattern indicating a track position, a sector position and the like. The magnetic recording and reproducing apparatus reads such preformat information from the magnetic recording medium so as to perform a predetermined tracking operation.

The magnetic transfer technique mentioned above allows time required for recording preformat information (preformat time) to be significantly reduced in comparison with a case where preformat information is recorded on a magnetic recording medium by a conventional STW (Servo Track Writer). For instance, preformat time of a magnetic recording medium of 20 G bytes is approximately ten minutes in the STW method, while it is even shorter than ten seconds in the magnetic transfer technique. Consequently, they place high hopes on the aforementioned magnetic transfer technique as the de facto standard of a preformat method for a magnetic recording medium.

Since a device for pattern plotting such as an optical exposure device or an EB (Electron Beam) exposure device is under extremely little restriction of dimension and of costs in comparison with a magnetic disk device, it is possible to employ a device of high accuracy. In the magnetic transfer technique, for example, an NRRO of a spindle (Non Repeatable Run Out: non repeatable component, which is not synchronized with rotation due to a run-out error of a spindle rotary axis) or the like is detected and correction operations are applied to light for pattern plotting, electron beams or the like, so that patterns under little influence of the NRRO can be formed. A master information medium prepared by the magnetic transfer technique can therefore realize higher pattern accuracy in comparison with a medium prepared by a method using the STW.

One method of the aforementioned magnetic transfer technique is to record all the preformat information on a master information medium and to transfer the preformat information onto a magnetic recording medium by magnetic transfer.

In the above-mentioned method, however, the size of preformat information patterns to be recorded on a magnetic recording medium is decided by the size of patterns of a magnetic film which are formed on a master information medium, i.e., the wavelength of light or electrons outputted from an optical exposure device, an EB exposure device or the like. It is, therefore, difficult to form preformat information patterns smaller than patterns recorded by a recording head. Consequently, there arises a problem that a preformat efficiency (a ratio of preformat information in a magnetic recording medium (which is hereinafter referred to as an occupation ratio)) declines.

BRIEF SUMMARY OF THE INVENTION

The present invention has been made with the aim of solving the above problem, and it is an object thereof to provide a preformat method for a magnetic recording medium, a magnetic recording medium, and a magnetic recording and reproducing apparatus which are capable of accuracy improvement of a servo information pattern and miniaturization of preformat information patterns, thereby realizing a predetermined tracking operation for a track of minute width.

A preformat method for a magnetic recording medium according to the present invention is for a magnetic recording medium which has at least servo information of preformat information recorded thereon in advance by magnetic transfer. In this preformat method, preformat information excluding the servo information is recorded by a recording head.

With such a preformat method for a magnetic recording medium wherein preformat information excluding the servo information is recorded by a recording head, the degree of freedom in pattern formation of preformat information is enhanced. Moreover, preformat information excluding the servo information can be recorded after the magnetic recording medium is incorporated into a magnetic recording and reproducing apparatus.

In the preformat method for a magnetic recording medium according to the present invention, the magnetic recording medium may have a transfer clock pattern, which is synchronized with the pattern of the servo information, recorded thereon. In this case, the recording head records preformat information excluding the servo information as patterns synchronized with the transfer clock pattern.

With such a preformat method for a magnetic recording medium wherein a clock of the recording head is synchronized with the transfer clock formed by magnetic transfer, the clock of the recording head is synchronized with a clock of the servo information. In this manner, the recording head can record preformat information excluding the servo information as patterns synchronized with the servo information. Consequently, a servo information pattern and preformat information patterns excluding the servo information pattern have the same phase, and thereby accurate preformat information can be provided.

The preformat method for a magnetic recording medium according to the present invention may include a step of rewriting preformat information by the recording head as patterns finer than those of the preformat information which has been recorded in advance by magnetic transfer.

With such a preformat method for a magnetic recording medium wherein the recording head records preformat information excluding servo information as patterns finer than those of the preformat information which has been recorded in advance, an occupation ratio of patterns including preformat information can be reduced.

A magnetic recording medium according to the present invention has at least a servo information pattern of preformat information patterns recorded thereon by magnetic transfer, and a transfer clock pattern synchronized with the servo information pattern.

When such a magnetic recording medium is incorporated into a magnetic recording and reproducing apparatus and a preformat operation is performed by a recording head, the transfer clock pattern synchronized with the servo information pattern can be used to detect phase differences between a servo information pattern and preformat information patterns excluding the servo information pattern with high accuracy and to synchronize the patterns with each other.

The magnetic recording medium according to the present invention may have a circular form in a plan view, and the transfer clock pattern may be recorded on an inner or outer periphery portion of the magnetic recording medium.

With such a magnetic recording medium which is a circular magnetic disk provided with, on an inner or outer periphery portion thereof, a transfer clock pattern to be used for phase difference detection and synchronization of a reproducing head and a recording head, a data recording area of the magnetic recording medium which is in general a dead area can be utilized effectively.

On the magnetic recording medium according to the present invention, information may be recorded by a perpendicular magnetic recording method.

When information is recorded on the magnetic recording medium by a perpendicular magnetic recording method, the surface recording density can be enhanced by magnetically recording information in a longitudinal direction (a circumferential direction).

A magnetic recording and reproducing apparatus according to the present invention includes: a magnetic recording medium having at least a servo information pattern of preformat information patterns recorded thereon in advance by magnetic transfer; a reproducing head for reproducing information recorded on the magnetic recording medium; and a recording head for recording information on the magnetic recording medium. Preformat information patterns excluding the servo information pattern are recorded on the magnetic recording medium by the recording head.

With such a magnetic recording and reproducing apparatus, the degree of freedom in pattern formation of pre format information is enhanced by recording a servo information pattern by magnetic transfer and recording preformat information patterns excluding the servo information pattern by the recording head.

In the magnetic recording and reproducing apparatus according to the present invention, the magnetic recording medium may have a transfer clock pattern, which is synchronized with the servo information pattern, recorded thereon in advance by magnetic transfer. Moreover, the magnetic recording and reproducing apparatus may further comprise phase synchronizing means to be used for recording information by the recording head using a clock synchronized with a transfer clock which is obtained by reproducing the transfer clock pattern by the reproducing head.

Using the phase synchronizing means of such a magnetic recording and reproducing apparatus, information can be recorded on the magnetic recording medium in a clock synchronized with the transfer clock, i.e., with the servo information. As a result, when preformat information is recorded on the magnetic recording medium, the servo information pattern and the preformat information patterns excluding the servo information pattern can have the same phase, and thereby accurate preformat information can be provided.

In the magnetic recording and reproducing apparatus according to the present invention, the magnetic recording medium may have a transfer clock pattern, which is synchronized with the servo information pattern, recorded thereon in advance by magnetic transfer. Moreover, the magnetic recording and reproducing apparatus may further comprise phase difference detecting means for detecting a phase difference between a transfer clock which is obtained by reproducing the transfer clock pattern by the reproducing head and a write-once clock which is recorded by the recording head.

Using the phase detecting means, such a magnetic recording and reproducing apparatus can detect a phase difference between the transfer clock and a clock to be used for recording preformat information on the magnetic recording medium by a magnetic recording head, i.e., a phase difference between the servo information and the preformat information. As a result, the servo information can be reproduced using a phase of the magnetic reproducing head corrected on the basis of the detected phase difference, while the preformat information excluding the servo information can be reproduced using a phase of the magnetic reproducing head which is not corrected. Consequently, the servo information and the preformat information excluding the servo information can be reproduced as patterns having substantially the same phase.

The magnetic recording and reproducing apparatus according to the present invention may further comprise frequency multiplying means to be used for recording information using a clock finer than the transfer clock.

Using the frequency multiplying means of such a magnetic recording and reproducing apparatus, information can be recorded on the magnetic recording medium in a clock finer than the transfer clock. Consequently, when preformat information is recorded on the magnetic recording medium, the occupation ratio of patterns including the preformat information can be reduced.

The above and further objects and features of the invention will more fully be apparent from the following detailed description with accompanying drawings.

DETAILED DESCRIPTION OF THE INVENTION

The following description will explain the present invention in detail with reference to the drawings illustrating some embodiments thereof.

First Embodiment

Figure 1:
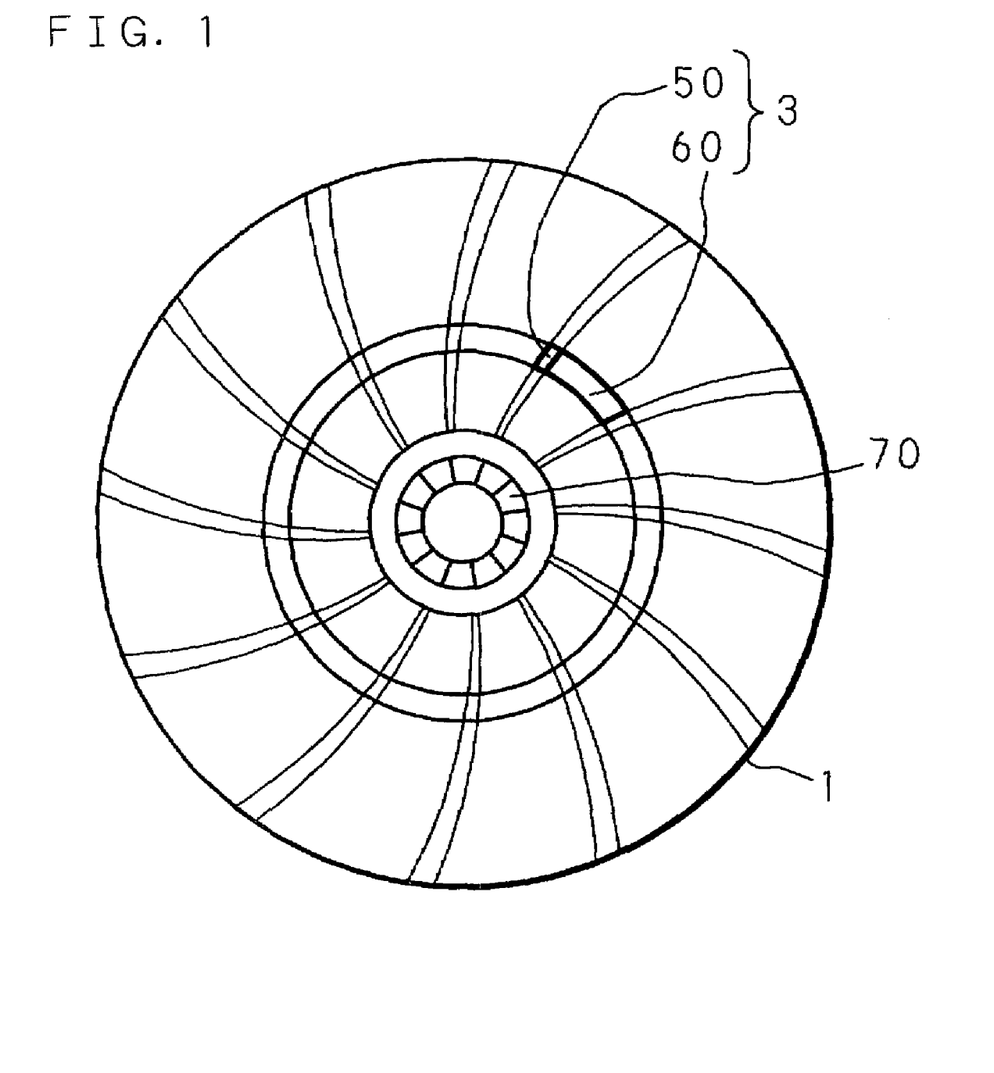
FIG. 1 is a schematic plan view of a magnetic disk according to the present invention.

FIG. 1 is a schematic plan view of a magnetic disk according to the present invention. As shown in FIG. 1, the magnetic disk 1 is divided into a plurality of data recording areas on the basis of tracks and sectors provided respectively in a radial direction and in a circumferential direction. The magnetic disk 1 manages information recorded thereon using track numbers and sector numbers. Each sector 3 is composed of a preformat information area 50 including preformat information and a data information area 60 including information created by a user, so that the preformat information areas 50 and the data information areas 60 are arranged alternately with a predetermined space (predetermined angle) in the circumferential direction of the magnetic disk 1. Recorded in the preformat information area 50 is preformat information including: a recovery pattern to be used for synchronizing a clock of a magnetic head when the magnetic disk device records/reproduces information; a sector mark pattern indicating the beginning of a sector; a servo information pattern to be used for detecting the relative position of a track on the magnetic recording medium with regard to the magnetic head; and a code data pattern indicating a track position, a sector position and the like.

Provided on an inner periphery portion of the magnetic disk 1 is a phasing area 70, which is composed of a transfer clock pattern recorded by magnetic transfer and a clock pattern (which is hereinafter referred to as a write-once clock pattern) recorded by a recording head. Detailed description thereof will be described later. It should be understood that the arrangement position of the phasing area 70 is not limited to the inner periphery portion of the magnetic disk 1. Although the phasing area is preferably arranged in an inner periphery portion of a magnetic disk 1 of a CSS (Contact Start Stop) type, or in an outer periphery portion of a magnetic disk 1 of a load/unload type, other arrangement may be employed.

Figure 2A:
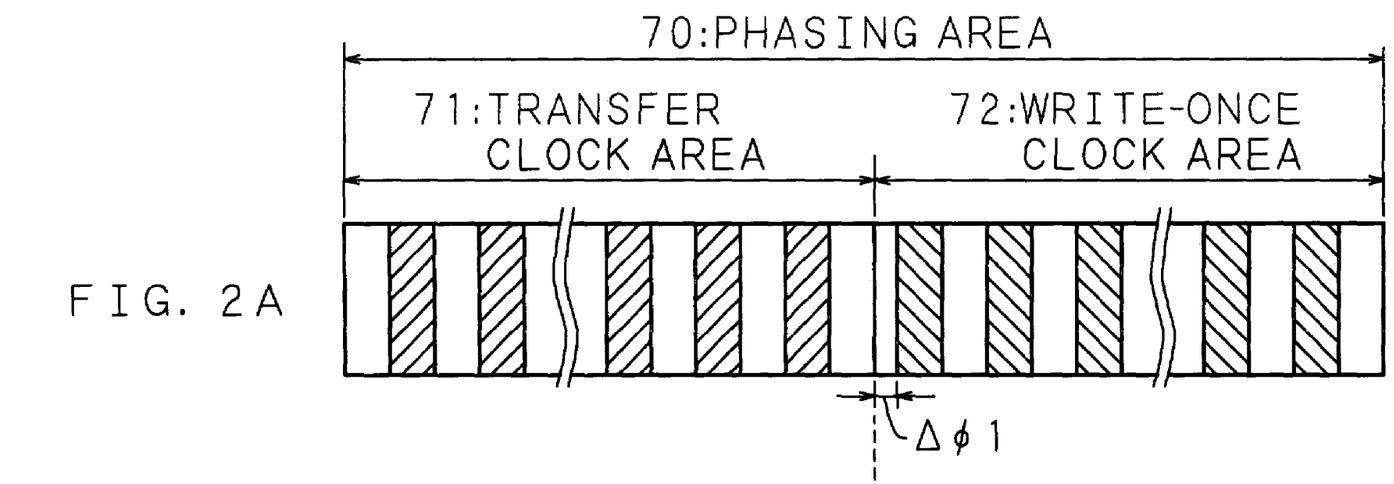
FIGS. 2A and 2B are views showing patterns in a phasing area of a magnetic disk according to First Embodiment and Second Embodiment of this invention.
Figure 2B:
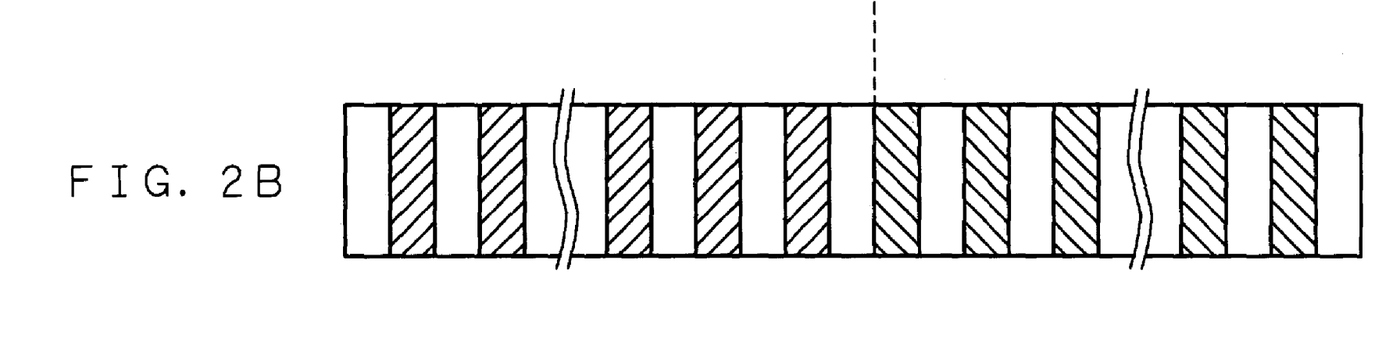

FIGS. 2A and 2B are views showing patterns in the phasing area 70 of the magnetic disk 1 according to First Embodiment and Second Embodiment. The phasing area 70 is composed of a transfer clock area 71 and a write-once clock area 72. In the transfer clock area 71, a transfer clock pattern synchronized with a servo information pattern is recorded from a master recording disk by magnetic transfer. In the write-once clock area 72, a write-once clock pattern is recorded by a recording head. In FIGS. 2A and 2B, the portion hatched with lines sloping up to the right and the blank portion in the transfer clock area 71 are magnetized in directions opposite to each other. For example, the hatched portion is magnetized right and the blank portion is magnetized left. Like the above, the portion hatched with lines sloping down to the right and the blank portion in the write-once clock area 72 are magnetized in directions opposite to each other. For example, the hatched portion is magnetized right and the blank portion is magnetized left. It should be understood that the magnetization direction is not limited to the longitudinal (circumferential) direction, and it is preferable to employ a perpendicular magnetic recording method, which generates magnetization in a perpendicular direction, for the purpose of increasing the recording density.

The magnetic disk device reproduces the transfer clock pattern and write-once clock pattern in the phasing area 70 illustrated in FIG. 2A by a reproducing head, detects a phase difference ($\Delta\phi 1$ in FIG. 2A) between a transfer clock and a write-once clock which are obtained by reproduction, and rewrites a write-once clock pattern in the write-once clock area 72 until the phase of a clock of the recording head is corrected and no phase difference exists between the clock of the recording head and the transfer clock as shown in FIG. 2B, in other words, until the clock of the recording head is synchronized with the transfer clock. Since the transfer clock is recorded as a pattern synchronized with the servo information, when preformat information excluding the servo information is recorded using a write-once clock of the recording head synchronized with the transfer clock, the servo information pattern can be recorded with high accuracy by magnetic transfer and the preformat information patterns excluding the servo information can be recorded as fine patterns synchronized with the servo information.

Figure 3:
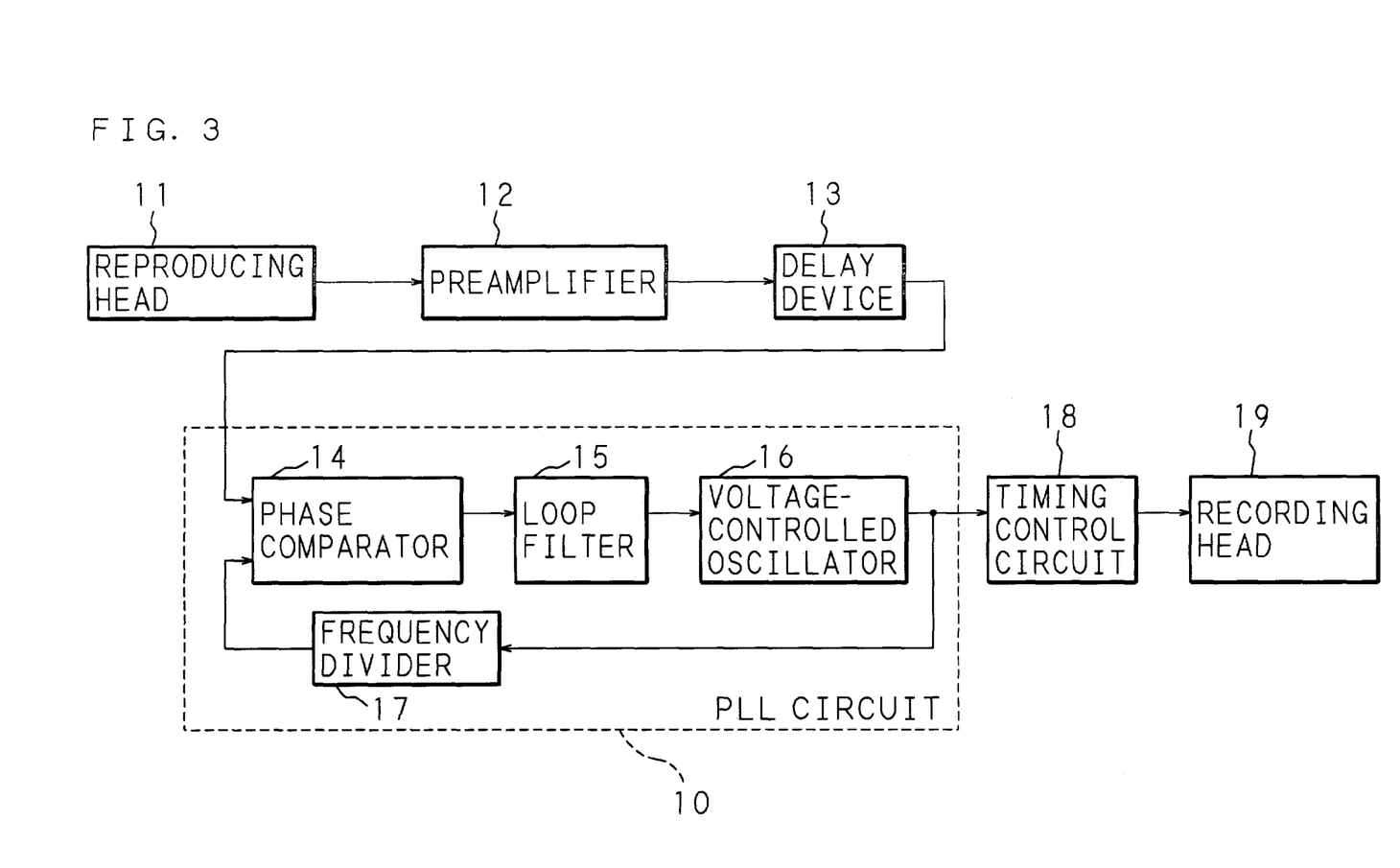
FIG. 3 is a block diagram showing the structure of a phase synchronization controlling unit of a magnetic disk device according to First Embodiment of this invention.

FIG. 3 is a block diagram showing the structure of a phase synchronization controlling unit of a magnetic disk device according to First Embodiment of this invention. The structure of the phase synchronization controlling unit will be first explained. A reproducing head 11 composed of a GMR (Giant Magnetoresistive) element or the like reproduces patterns recorded on the magnetic disk 1 and transforms the N pole and S pole of reproduced patterns respectively into positive electric signals and negative electric signals, to generate reproduction signals of electric signals based on the patterns. The reproduction signals undergo waveform shaping by a preamplifier 12 and time delaying for a predetermined time by a delay device 13, and are outputted to a phase synchronizing loop (which is hereinafter referred to as an PLL (Phase-Locked Loop)) circuit 10.

The PLL circuit 10 is provided with a phase comparator 14, a loop filter 15, a voltage-controlled oscillator 16 and a frequency divider 17.

The phase comparator 14 is provided with two input units, and has a function to compare a phase of an inputted reference signal and a phase of an inputted comparator signal. A reproduction signal which is generated by the reproducing head 11 and outputted from the delay device 13 is inputted to one input unit of the phase comparator 14 as a reference signal, while an output signal of the frequency divider 17, which will be explained later, is inputted to the other input unit of the phase comparator 14 as a comparator signal. The output signal is outputted to the loop filter 15 after the phase comparing operation.

The loop filter 15 is configured as a low-pass filter, which removes high-frequency noise from inputted signals and outputs the signals to the voltage-controlled oscillator 16.

The voltage-controlled oscillator 16 transforms an oscillation frequency on the basis of the inputted signal to generate signals. The generated signals are outputted both to the PLL circuit 10 as output signals and to the frequency divider 17.

The frequency divider 17 divides a frequency of an inputted signal to be 1/N times (the N is hereinafter referred to as a dividing ratio) and outputs the signal after frequency division to the phase comparator 14 as a comparator signal.

A timing control circuit 18 inputs the signal outputted from the PLL circuit 10, controls recording timing of a recording head 19, generates code information and outputs the generated code information to the recording head 19. The recording head 19 records information on the magnetic disk 1 on the basis of the supplied information.

A method for detecting a phase difference and a method for controlling phase synchronization will be explained next. First, 0 is set as a delay time of the delay device 13 and 1 is set as a dividing ratio of the frequency divider 17. In this state, a reproduction signal which is obtained by reproducing a transfer clock pattern in the transfer clock area 71 by the reproducing head 11 is inputted as a reference signal of the PLL circuit 10. On the basis of a signal outputted from the PLL circuit 10, the recording head 19 records a write-once clock pattern in the write-once clock area 72.

Next, after the spindle motor makes the magnetic disk 1 go into a 360-degree rotation, a reproduction signal which is obtained from a transfer clock pattern in the transfer clock area 71 is inputted again to the PLL circuit 10 as a reference signal. A reproduction signal, which is obtained by reproducing a pattern in the write-once clock area 72 by the reproducing head 11 after the spindle motor further rotates, is a reproduction signal obtained from a write-once clock pattern. Therefore, output (voltage) of the phase comparator 14 changes according to a phase difference between the transfer clock pattern and the write-once clock pattern. A delay time is corrected on the basis of the output (voltage) and a write-once clock pattern is rewritten in the write-once clock area 72.

The rotation of the magnetic disk 1 by the spindle motor, the detection of the phase difference and the correction of the delay time are repeatedly performed until the output (voltage) of the phase comparator 14 based on the transfer clock pattern and the write-once clock pattern stops changing. In the state where the output (voltage) does not change, the write-once clock pattern is synchronized with the transfer clock pattern. In other words, the clock of the recording head 19 is synchronized with the servo information pattern.

After the synchronization is accomplished, preformat information patterns excluding the servo information pattern is rewritten as fine patterns in the preformat information area 50 with the frequency being multiplied, by using a delay time enabling synchronization and changing the dividing ratio of the frequency divider 17. With such a process, the preformat information can be recorded as fine patterns (realizing a high track density) having no phase difference and the magnetic disk device can obtain accurate preformat information.

Table 1 shows the structure of sectors to be recorded on a master recording disk. Patterns corresponding to preformat information to be transferred are formed on a magnetic film of the master recording disk with high accuracy by a device for plotting data on a master medium provided with a spindle of high accuracy or with a function for correcting the NRRO of the spindle, or the like.

TABLE 1

| | SECTOR | | | | |
|---|---|---|---|---|---|
| | PREFORMAT INFORMATION AREA | | | | DATA |
| | MR/W RECOVERY | MSM | MSP | MGCD | INFORMATION AREA |
| AREA | 1000 | 18 | 256 | 200 | — |
| PATTERN LENGTH | 4T | 16T | 4T | 4T | — |

In Table 1, the MR/W (Master Read-Write) recovery indicates a recovery pattern, the MSM (Master Sector Mark) indicates a sector mark pattern, the MSP (Master Servo Pattern) indicates a servo information pattern and the MGCD (Master Gray Code Data) indicates a code data pattern. These preformat information patterns are recorded on the magnetic disk 1 by magnetic transfer. The magnetic disk device performs a predetermined tracking operation on the basis of information read from each of these patterns recorded on the magnetic disk 1 by magnetic transfer. It should be noted that the "M" used at the beginning of the MR/W recovery, the MSM, the MSP and the MGCD indicates the master recording disk (the same expression is also used in the following description).

Table 2 shows the structure of sectors to be recorded on the magnetic disk 1.

TABLE 2

| | SECTOR | | | | |
|---|---|---|---|---|---|
| | PREFORMAT INFORMATION AREA | | | | DATA |
| | R/W RECOVERY | SM | SP | GCD | INFORMATION AREA |
| AREA | 500 | 18 | 256 | 100 | — |
| PATTERN LENGTH | 2T | 16T | 4T | 2T | — |

Regarding Table 2, the intensive magnetic field of the recording head 19 keeps the reproducing head 11 from operation thereof while the previous sector of the R/W (Read-Write) recovery is recorded, and the reproducing head 11 waits until the operation thereof is permitted. The R/W recovery is a recovery pattern to be used for synchronizing the clock after the reproducing head 11 starts operation and for performing AGC (Auto Gain Control). The SM (Sector Mark) indicates a sector mark pattern, the SP (Servo Pattern) indicates a servo information pattern and the GCD (Gray Code Data) indicates a code data pattern.

First, the R/W recovery, the SM, the SP and the GCD is recorded on the magnetic disk 1 by magnetically transferring the MR/W recovery, the MSM, the MSP and the MGCD of the master recording disk, respectively.

Next, the magnetic disk device synchronizes the recording head 19 with the transfer clock, i.e. with the SP, and rewrites the R/W recovery and the GCD other than the SP as fine patterns by the recording head 19 successively from the sector 0 of the disk. By recording R/W recovery and the GCD in all sectors around the disk and similarly recording the R/W recovery and the GCD with the recording head 19 shifted in a radial direction by a track width, preformat information patterns can be recorded continuously in the radial direction. Preformat information patterns are recorded on the whole area of the magnetic disk 1 in such a manner, so as to create the preformat information area 50.

For example, for forming a fine R/W recovery from the MR/W recovery, the frequency is multiplied by setting the dividing ratio of the frequency divider 17 in the PLL circuit 10 large. Although this embodiment sets the frequency of the R/W recovery (period: 2T) two times the frequency of the MR/W recovery (period: 4T), the present invention is not limited to this case. In particular, it is preferable to record the R/W recovery as a fine pattern, since the R/W recovery is a pattern to be used for synchronizing the magnetic head when the magnetic disk device records/reproduces information.

Although the above description explains an example for rewriting the R/W recovery and the GCD of preformat information by the recording head 19, the SM may be rewritten by the recording head 19.

A feature of the present invention lies in that a master magnetic disk having SP, for which high accuracy is required, of high accuracy is used, patterns are formed (recorded) on the magnetic disk 1 by magnetic transfer, and the R/W recovery, the SM and the GCD other than the SP are rewritten using a clock of the recording head 19 which is synchronized with the SP. Another feature of the invention lies in that, after the recording head 19 is synchronized with the SP as described above, the R/W recovery, the SM, the SP and the GCD other than the SP are recorded as patterns finer than the patterns formed by magnetic transfer, using the frequency divider 17 which functions as frequency multiplying means. In this manner, when the magnetic disk device records/reproduces information, the clock of the magnetic head can be precisely synchronized using the R/W recovery before the SM, the SP and the GCD are read, and thereby a predetermined tracking operation can be performed with high accuracy. Moreover, the ratio of the R/W recovery the SM and the GCD in the magnetic disk can be reduced, thereby enabling a high track density.

It should be noted that the present invention is not limited to the method described above for setting a delay time synchronized with the transfer clock pattern by repeatedly recording in a predetermined sector a write-once pattern with delay time being changed. The delay time may be set by recording write-once clock patterns in a plurality of sectors at one time with respective delay times being changed from each other, and retrieving a sector which is synchronized with the transfer clock pattern.

Second Embodiment

Figure 4:
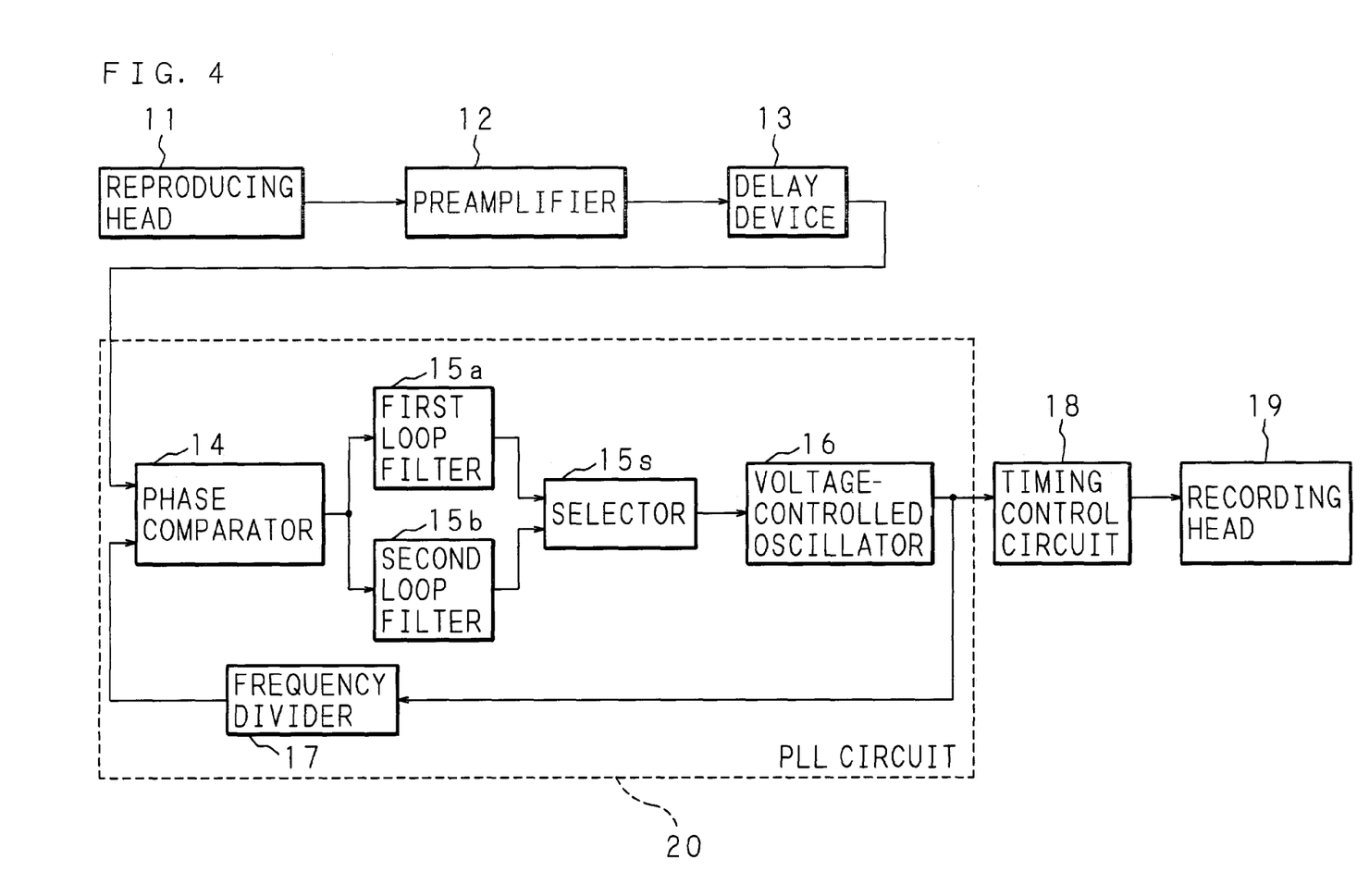
FIG. 4 is a block diagram showing the structure of a phase synchronization controlling unit of a magnetic disk device according to Second Embodiment of this invention.

FIG. 4 is a block diagram showing the structure of a phase synchronization controlling unit of a magnetic disk device according to Second Embodiment of this invention.

The PLL circuit 20 includes, in place of the loop filter 15 disposed in the PLL circuit 10 explained in First Embodiment, a first loop filter 15a, a second loop filter 15b and a selector 15s.

The first loop filter 15a is a filter of quick response having a small time constant, which is used for synchronizing a clock of the reproducing head 11 and a clock of the recording head 19 with each other. The second loop filter 15b is a filter having a large time constant, which is used for recording the preformat information patterns in the preformat information area 50. The selector 15s has a function to select the first loop filter 15a or the second loop filter 15b under a predetermined condition. With the PLL circuit 20 provided with these elements, a phase difference can be detected with high sensitivity in the stage of synchronizing phases.

Since other structures are the same as those of First Embodiment, like codes are used to refer to corresponding parts and detailed explanation thereof is omitted. Moreover, since a phase difference detection method and a phase synchronization control method are the same as those of First Embodiment, detailed explanation thereof is also omitted.

Table 3 shows the structure of sectors to be recorded on a master recording disk.

TABLE 3

| | SECTOR | | | | |
|---|---|---|---|---|---|
| | PREFORMAT INFORMATION AREA | | | | DATA |
| | MR/W RECOVERY | MSM | MSP | MGCD | INFORMATION AREA |
| AREA | 2000 | 18 | 256 | NO DATA | — |
| PATTERN LENGTH | 4T | 16T | 4T | — | — |

In the case of Table 3, no information is recorded in the MGCD area. Moreover, since the second loop filter 15b has a large time constant and clock synchronization is time-consuming, the MR/W recovery area is two times as long as that of First Embodiment. Regarding the data rewriting operation, this is equivalent to several times since the operation does not include a step of writing the end of the previous sector. The R/W recovery, the SM and the SP are recorded on the magnetic disk 1 by magnetically transferring the MR/W recovery, the MSM and the MSP of the master recording disk, respectively, and moreover, the R/W recovery, the SM and the GCD are recorded using a clock of the recording head 19 synchronized with the SP. Once the clock of the recording head 19 and the clock of the reproducing head 11 are synchronized with each other, the phase of the write-once clock pattern and the phase of the transfer clock pattern maintain synchronism with each other afterwards. Consequently, it is possible to rewrite the R/W recovery and the SM, not to rewrite the SP and to write the GCD.

Third Embodiment

The above description of First Embodiment and Second Embodiment explained a case where the recording head records information on a magnetic disk with the phase of the servo information pattern and the phase of the preformat information patterns excluding the servo information pattern being synchronized with each other. In this embodiment, a recording head first records on a magnetic disk preformat information patterns excluding a servo information pattern and a write-once clock pattern of a phasing area, and then the phase differences between the servo information pattern and the preformat information patterns excluding the servo information pattern are detected using the phasing area. Next, the servo information pattern is reproduced using a phase of the reproducing head corrected on the basis of the detected phase difference (delay time), while the preformat information patterns excluding the servo information pattern are reproduced using a phase of the reproducing head which is not corrected. Since the structure of the phase synchronization controlling unit is the same as that of First Embodiment and Second Embodiment, detailed explanation thereof is omitted.

Figure 5A:
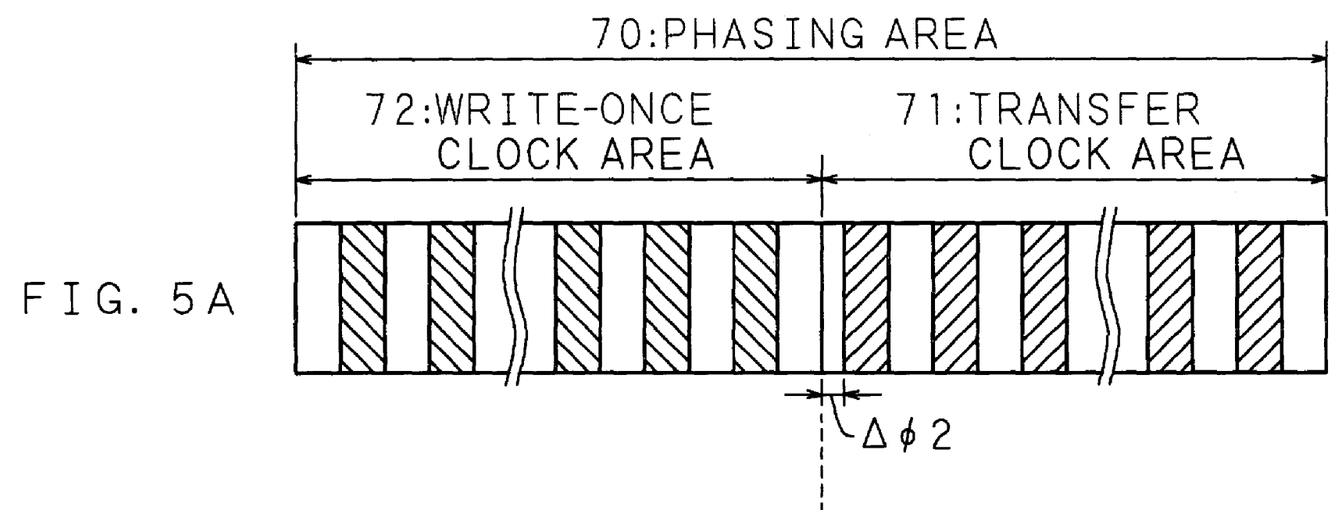
FIGS. 5A and 5B are views showing patterns in a phasing area of a magnetic disk according to Third Embodiment of this invention.
Figure 5B:
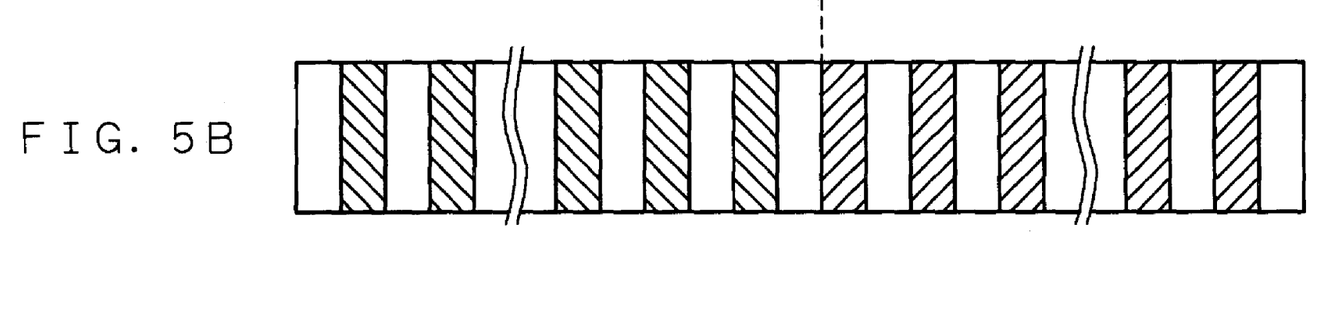

FIGS. 5A and 5B are views showing patterns in a phasing area of a magnetic disk according to Third Embodiment. A phasing area 70 has, dissimilarly from First Embodiment and Second Embodiment, a write-once clock area 72 before a transfer clock area 71.

The magnetic disk device records a write-once pattern in the write-once clock area 72 of the phasing area 70 by the recording head 19 as shown in FIG. 5A, reproduces the write-once clock pattern and a transfer clock pattern by the reproducing head 11, detects a phase difference ($\Delta\phi 2$ in FIG.

5A) between respective clocks obtained by reproduction, corrects the phase of the recording head 19 (sets the delay time) and stores a phase difference (delay time) which realizes a state where no phase difference exists as shown in FIG. 5B, i.e., a state where synchronization is accomplished. Next, the magnetic disk device reproduces the servo information pattern using a phase of the reproducing head corrected on the basis of the stored phase difference while the magnetic disk device reproduces the preformat information patterns excluding the servo information pattern using a phase of the reproducing head 11 which is not corrected. In this manner, reproduction provides servo information as fine patterns (high track density) substantially having no phase difference, and thereby the magnetic disk device can obtain accurate servo information.

It should be noted that the phase difference between the transfer clock and the write-once clock recorded by the recording head 19 may be detected in the undermentioned method. The magnetic dick device records a write-once clock pattern in the write-once clock area 72 of the phasing area 70 as shown in FIG. 5A by the recording head 19. The magnetic disk device then reproduces the write-once clock pattern by the reproducing head, reproduces the transfer clock pattern with the clock of the reproducing head being synchronized with the write-once clock pattern and detects the output amplitude. The same process is repeated after setting the delay time of the clock of the reproducing head. Since the maximum output amplitude is obtained when the phases accord, the delay time of that time may be stored (set) to be used for a clock for reproducing the servo information pattern.

Table 4 shows the structure of sectors to be recorded on a master recording disk.

TABLE 4

| SECTOR | | | | |
|---|---|---|---|---|
| PREFORMAT INFORMATION AREA | | | | DATA |
| MR/W RECOVERY | MSM | MSP | MGCD | INFORMATION AREA |
| AREA | NO DATA | NO DATA | 256 | NO DATA | — |
| PATTERN LENGTH | — | — | 4T | — | — |

For performing magnetic transfer, it is required to put the master recording disk (master disk) and the magnetic disk 1 (slave disk) in close contact with each other. In a case where the space between two disks includes foreign matter, the disks are put out of close contact and there occurs a transfer flaw. In general, such a transfer flaw occasionally occurs since accuracy improvement of the recording density requires reduction of the distance between the master recording disk and the magnetic disk facing each other. In the present invention, however, only the MSP information is recorded on the master magnetic disk as shown in Table 4 and to be transferred to the magnetic disk 1 as the SP by magnetic transfer, and therefore it is possible to reduce the incidence of a transfer flaw. The R/W recovery, the SM and the GCD are recorded on the magnetic disk 1 as fine patterns in a clock of the recording head 19.

In the present invention, as described above in detail, a servo information pattern is recorded on a magnetic recording medium by magnetic transfer technique from a master information medium of high accuracy while preformat information patterns excluding the servo information pattern is recorded on the magnetic recording medium by a recording head as fine patterns synchronized with the servo information pattern. In this manner, a clock to be used for reading the servo information pattern can be created precisely, and thereby accurate servo information can be detected. Moreover, the ratio of the preformat information patterns excluding the servo information pattern in the magnetic recording medium can be reduced, i.e., the format efficiency can be enhanced, and a high track density can be realized.

Moreover, in this invention, at least the servo information pattern of the preformat information patterns which is recorded by magnetic transfer is reproduced by the reproducing head, and the preformat information patterns excluding the servo information pattern is recorded on the magnetic recording medium by the recording head as fine patterns. The invention includes a step of detecting phase differences between the servo information pattern reproduced by the reproducing head at the time of information pattern reproduction and the preformat information patterns, excluding the servo information pattern, which are recorded by the recording head. In this manner, the servo information pattern is reproduced by correcting reproduction information using the detected phase differences so that the servo information pattern and the preformat information patterns excluding the servo information pattern can give accurate information. Moreover, the ratio of the preformat information patterns excluding the servo information pattern in the magnetic recording medium can be reduced and a high track density can be realized.

Furthermore, in this invention, when the magnetic recording medium is a circular magnetic disk, the data recording area of the magnetic disk can be effectively utilized by arranging the phasing area, which is used for detecting the phases of clocks of the reproducing head and the recording head and synchronizing the phases with each other, on an inner or outer periphery portion of the magnetic disk. Moreover, the surface recording density can be further enhanced by employing a perpendicular magnetic recording method as a recording method for the magnetic recording medium.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A preformat method for a magnetic recording medium, for recording preformat information including servo information on a magnetic recording medium by a magnetic recording apparatus including a recording head, comprising steps of:
   recording at least the servo information of the preformat information on the magnetic recording medium by magnetic transfer; and
   recording preformat information excluding the servo information on the magnetic recording medium by the recording head.

2. A preformat method for a magnetic recording medium, for recording preformat information including servo information on a magnetic recording medium by a magnetic recording and reproducing apparatus including a recording head and a reproducing head, comprising steps of:

recording at least the servo information of the preformat information on the magnetic recording medium by magnetic transfer;

reproducing preformat information recorded by magnetic transfer;

fining a pattern of the reproduced preformat information; and recording the fined preformat information on the magnetic recording medium by the recording head.

3. A preformat method for a magnetic recording medium, for recording preformat information including servo information on a magnetic recording medium by a magnetic recording and reproducing apparatus including a recording head and a reproducing head, comprising steps of:

recording at least the servo information of the preformat information on the magnetic recording medium by magnetic transfer;

recording a transfer clock pattern, which is synchronized with a pattern of the servo information, on the magnetic recording medium; and recording preformat information excluding the servo information on the magnetic recording medium by the recording head, as patterns synchronized with the transfer clock pattern.

4. The preformat method for a magnetic recording medium according to claim 3, further comprising steps of:

reproducing preformat information recorded by magnetic transfer;

fining a pattern of the reproduced preformat information; and recording the fined preformat information on the magnetic recording medium by the recording head.

5. A magnetic recording medium comprising:

a servo information pattern of preformat information patterns, which is recorded by magnetic transfer;

a transfer clock pattern synchronized with the servo information pattern; and preformat information patterns excluding the servo information pattern recorded as fine patterns after said servo information pattern is recorded.

6. The magnetic recording medium according to claim 5, which has a circular form in a plan view, wherein the transfer clock pattern is recorded on an inner or outer periphery portion of the magnetic recording medium.

7. The magnetic recording medium according to claim 6, wherein information is recorded by a perpendicular magnetic recording method.

8. The magnetic recording medium according to claim 5, wherein information is recorded by a perpendicular magnetic recording method.

9. A magnetic recording and reproducing apparatus comprising:

a reproducing head for reproducing information recorded on a magnetic recording medium having at least a servo information pattern of preformat information patterns which is recorded thereon in advance by magnetic transfer; and a recording head for recording preformat information patterns excluding the servo information pattern on the magnetic recording medium.

10. The magnetic recording and reproducing apparatus according to claim 9, wherein the magnetic recording medium has a transfer clock pattern, which is synchronized with the servo information pattern, recorded thereon in advance by magnetic transfer, further comprising a phase synchronizing unit for synchronizing a phase of a clock of the recording head for recording information with a phase of a transfer clock obtained by reproducing the transfer clock pattern by the reproducing head.

11. The magnetic recording and reproducing apparatus according to claim 10, further comprising a frequency multiplying unit for multiplying a frequency for recording information in a clock finer than the transfer clock.

12. The magnetic recording and reproducing apparatus according to claim 9, wherein the magnetic recording medium has a transfer clock pattern, which is synchronized with the servo information pattern, recorded thereon in advance by magnetic transfer, further comprising a phase difference detecting unit for detecting a phase difference between a transfer clock which is obtained by reproducing the transfer clock pattern by the reproducing head and a write-once clock which is recorded by the recording head.

13. The magnetic recording and reproducing apparatus according to claim 12, further comprising a frequency multiplying unit for multiplying a frequency for recording information in a clock finer than the transfer clock.

14. The magnetic recording and reproducing apparatus according to claim 9, further comprising a frequency multiplying unit for multiplying a frequency for recording information in a clock finer than the transfer clock.

15. The magnetic recording and reproducing apparatus according to claim 9, wherein the magnetic recording medium has a transfer clock pattern, which is synchronized with the servo information pattern, recorded thereon in advance by magnetic transfer, further comprising phase synchronizing means for synchronizing a phase of a clock of the recording head for recording information with a phase of a transfer clock obtained by reproducing the transfer clock pattern by the reproducing head.

16. The magnetic recording and reproducing apparatus according to claim 15, further comprising means for multiplying a frequency for recording information in a clock finer than the transfer clock.

17. The magnetic recording and reproducing apparatus according to claim 9, wherein the magnetic recording medium has a transfer clock pattern, which is synchronized with the servo information pattern, recorded thereon in advance by magnetic transfer, further comprising phase difference detecting means for detecting a phase difference between a transfer clock which is obtained by reproducing the transfer clock pattern by the reproducing head and a write-once clock which is recorded by the recording head.

18. The magnetic recording and reproducing apparatus according to claim 17, further comprising means for multiplying a frequency for recording information in a clock finer than the transfer clock.

19. The magnetic recording and reproducing apparatus according to claim 9, further comprising means for multiplying a frequency for recording information in a clock finer than the transfer clock.

* * * * *